(12) United States Patent
Natsume et al.

(10) Patent No.: US 8,821,098 B2
(45) Date of Patent: Sep. 2, 2014

(54) LOAD PORT

(75) Inventors: Mitsuo Natsume, Toyohashi (JP); Shin Kawahisa, Minato-ku (JP); Takumi Mizokawa, Toyohashi (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 424 days.

(21) Appl. No.: 12/628,822

(22) Filed: Dec. 1, 2009

(65) Prior Publication Data
US 2010/0135753 A1    Jun. 3, 2010

(30) Foreign Application Priority Data

Dec. 2, 2008   (JP) ................................ 2008-307023

(51) Int. Cl.
    *H01L 21/677*     (2006.01)
(52) U.S. Cl.
    USPC .......................................... 414/217; 414/411
(58) Field of Classification Search
    CPC ...................... H01L 21/6773; H01L 21/67772
    USPC ................................................. 414/411, 217
    See application file for complete search history.

(56) References Cited

U.S. PATENT DOCUMENTS

| | | | | |
|---|---|---|---|---|
| 5,273,423 A | * | 12/1993 | Shiraiwa | 432/241 |
| 5,988,233 A | * | 11/1999 | Fosnight et al. | 141/63 |
| 6,158,946 A | * | 12/2000 | Miyashita | 414/411 |
| 6,199,604 B1 | * | 3/2001 | Miyajima | 141/98 |
| 6,368,411 B2 | * | 4/2002 | Roberson et al. | 118/715 |
| 6,899,145 B2 | * | 5/2005 | Aggarwal | 141/11 |
| 7,360,346 B2 | * | 4/2008 | Miyajima et al. | 53/432 |
| 2006/0045662 A1 | * | 3/2006 | Aalund et al. | 414/217 |
| 2008/0056860 A1 | * | 3/2008 | Natume | 414/222.01 |
| 2009/0169342 A1 | * | 7/2009 | Yoshimura et al. | 414/217 |
| 2009/0245978 A1 | * | 10/2009 | Okabe | 414/217 |

FOREIGN PATENT DOCUMENTS

| | | |
|---|---|---|
| JP | 2006-351619 | 12/2006 |
| WO | WO 2005124853 A1 * | 12/2005 |

* cited by examiner

*Primary Examiner* — Jonathan Snelting
(74) *Attorney, Agent, or Firm* — Oblon, Spivak, McClelland, Maier & Neustadt, L.L.P.

(57) ABSTRACT

A load port is disclosed which allows a wafer to be transferred between the inside of a FOUP and the inside of a semiconductor fabrication apparatus even during a purge operation. The load port is provided adjacent the semiconductor fabrication apparatus in a clean room and includes a purge stage having a purge port through which a gas atmosphere in the FOUP is replaced into nitrogen gas or dry air, an opener stage provided in a juxtaposed relationship with the purge stage and having an opening communicating with the inside of the semiconductor fabrication apparatus and a door section capable of opening and closing the opening, and a moving mechanism for moving the FOUP between the purge stage and the opener stage.

17 Claims, 7 Drawing Sheets

LOAD PORT

BACKGROUND OF THE INVENTION

1. Field of the Invention

This invention relates to a load port provided adjacent a semiconductor fabrication apparatus in a clean room.

2. Description of the Related Art

In a fabrication process of semiconductors, processing of a wafer in a clean room is carried out in order to achieve a high yield and high quality. However, in this day of advanced high integration of devices, enhanced refinement of circuits and enhanced increase in size of wafers, it is difficult in terms of the cost and the technique to manage fine dust in an entire clean room. Therefore, in recent years, as a method to be used in place of the improvement in cleanness in the entire clean room, a countermeasure of introducing a "mini environment system" wherein the cleanness is improved only in a local space around a wafer to carry out transportation of and other processes for the wafer is adopted. In the mini environment system, a containment called FOUP (Front Opening Unified Pod) for transporting and storing a wafer in a highly clean environment and a load port which is an apparatus at an interface section for transferring a wafer in the FOUP to and from a semiconductor fabrication apparatus and transferring the FOUP to and from a transporting apparatus are utilized as significant apparatus. In short, while a high degree of cleanness is maintained in the clean room, particularly in the FOUP and the semiconductor fabrication apparatus, a low degree of cleanness is used in the space in which the load port is disposed, or in other words, used outside the FOUP and the semiconductor fabrication apparatus, so that the cost for construction and operation of the clean room is suppressed.

Further, in a state wherein a door section provided on the load port is kept in close contact with a door provided on the rear face of the FOUP, the door section and the door are opened at the same time and the wafer in the FOUP is supplied into the semiconductor fabrication apparatus. Thereafter, the wafer is subjected to various processes or workings and then accommodated from within the semiconductor fabrication apparatus back into the FOUP.

Incidentally, while the inside of the semiconductor fabrication apparatus is kept in a predetermined gas atmosphere suitable for processing or working of a wafer, when the wafer is to be fed out from within the FOUP into the semiconductor fabrication apparatus, the internal space of the FOUP and the internal space of the semiconductor fabrication apparatus are brought into communication with each other. Accordingly, if the environment in the FOUP is lower in cleanness than in the semiconductor fabrication apparatus, then the gas in the FOUP possibly advances into the semiconductor fabrication apparatus and has a bad influence on the gas atmosphere in the semiconductor fabrication apparatus. Also there is another subject that, when the wafer is accommodated from within the semiconductor fabrication apparatus into the FOUP, an oxide film may be formed on the surface of the wafer with water, oxygen or some other gas in the gas atmosphere in the FOUP.

Thus, Japanese Patent Laid-Open No. 2006-351619 discloses a load port which places the inside of the FOUP into a gas atmosphere same or substantially same as that in the semiconductor fabrication apparatus before the internal space of the FOUP and the internal space of the semiconductor fabrication apparatus are communicated with each other. To this end, the load port is configured such that, when it is detected that a FOUP in which a wafer is accommodated is placed on a receiving plate of the load port, predetermine gas such as, for example, nitrogen gas or inert gas is introduced into the FOUP to replace the gas atmosphere in the FOUP into a predetermined gas atmosphere.

Also a mode is known wherein a purge apparatus for introducing predetermined gas such as nitrogen gas or dry air into a FOUP to replace the gas in the FOUP into the predetermined gas is provided separately from a load port. After the inside of the FOUP is replaced into the predetermined gas atmosphere by the purse apparatus, the FOUP is transported to the load port so that later processes are carried out.

SUMMARY OF THE INVENTION

However, where the load port is configured such that, when it is detected that a FOUP is placed on the receiving plate of the load port, gas such as nitrogen gas or dry air is introduced into the FOUP to replace the inside of the FOUP into the predetermined gas atmosphere, during the replacing operation, that is, during the purge operation, the receiving section of the load port is occupied by the FOUP being subject to the purge operation. Therefore, the original function of the load port, that is, the function of feeding a wafer between the inside of the FOUP and the inside of the semiconductor fabrication apparatus, cannot be exhibited, resulting in a problem that the operation efficiency drops.

Meanwhile, the latter mode requires the purge apparatus for exclusive use separately from the load port. Besides, the distance over which the FOUP is moved from the purge apparatus to the receiving plate of the load port increases as the relatively spaced distance between the load port and the purge apparatus increase, similarly resulting in a problem that the operation efficiency drops.

It is an object of the present invention to provide a load port which makes it possible to feed a wafer between the inside of a FOUP and the inside of a semiconductor fabrication apparatus also during a purge operation. It is another object of the present invention to provide a load port wherein the distance between the position at which a purge operation is carried out and the position at which a wafer is fed between the inside of s FOUP and the inside of a semiconductor fabrication apparatus is reduced as far as possible to decrease the distance of movement of the FOUP so that the operation efficiency can be improved.

In order to attain the object described above, according to the present invention, there is provided a load port provided adjacent a semiconductor fabrication apparatus in a clean room for receiving a FOUP transported thereto and transferring wafers accommodated in the FOUP between the inside of the semiconductor fabrication apparatus and the inside of the FOUP, including a purge stage having a purge port through which a gas atmosphere in the FOUP is replaced into nitrogen gas or dry air, an opener stage provided in a juxtaposed relationship with the purge stage and having an opening communicating with the inside of the semiconductor fabrication apparatus and a door section capable of opening and closing the opening, and a moving mechanism for moving the FOUP between the purge stage and the opener stage. The load port is used in a fabrication process of semiconductors.

In the load port, an operation for blowing nitrogen gas or dry air from the purge port into the FOUP to replace the gas atmosphere in the FOUP into the nitrogen gas or dry air, that is, the purge operation, in the purge stage and an operation for transferring wafers between the inside of the FOUP and the inside of the semiconductor fabrication apparatus in the opener stage can be carried out at the same time. Therefore, even during the replacement operation, that is, even during the purge operation, such a situation that the load port is occupied by the FOUP being subject to the purge operation can be prevented. Consequently, even during the replacement or purge operation, it is possible to transfer wafers between the inside of the FOUP and the inside of the semiconductor fabrication apparatus, and the operation efficiency is improved. Besides, since the purge stage and the opener stage are provided in a juxtaposed relationship with each other and a FOUP can be moved between the purge stage and the opener stage by the moving mechanism, the position at which the purge operation is carried out and the position at which wafers are transferred between the inside of the FOUP and the inside of the semiconductor fabrication apparatus can be disposed as near as possible. Consequently, the distance of movement of the FOUP can be reduced and further enhancement of the operation efficiency can be anticipated. Here, the "semiconductor fabrication apparatus" in the present invention includes both of an apparatus which includes a feeding chamber disposed at a position directly adjacent a load port and another apparatus which does not include such a feeding chamber. It is to be noted that, in the feeding chamber, a feeder is provided which feeds wafers in a FOUP one by one or feeds a multi-stage cassette which is removably set in a FOUP and accommodates a plurality of wafers therein between the inside of the FOUP and the inside of the semiconductor fabrication apparatus body.

Further, in order to solve a problem that, where an opening and closing section in the opener stage is opened to allow the inside of the FOUP and the inside of the semiconductor fabrication apparatus to be communication with each other, the gas atmosphere in the FOUP is degraded in cleanness in comparison with that immediately after the purge operation and an oxide film is formed on the surface of a wafer with water, oxygen or some other gas in the gas atmosphere in the FOUP, the opener stage may include a sub purge section capable of blowing nitrogen gas or dry air into the FOUP when the door section is operated to open the opening and closing section.

With the load port according to the present invention, even during a purge operation, wafers can be transferred between the inside of the FOUP and the inside of the semiconductor fabrication apparatus. Further, a FOUP can be moved suitably between the position at which the purge operation is carried out and the position at which wafers are transferred between the inside of the FOUP and the inside of the semiconductor fabrication apparatus. Consequently, the operation efficiency is improved.

The above and other objects, features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENT

In the following, a load port according to a preferred embodiment of the present invention is described with reference to the drawings.

Figure 1:
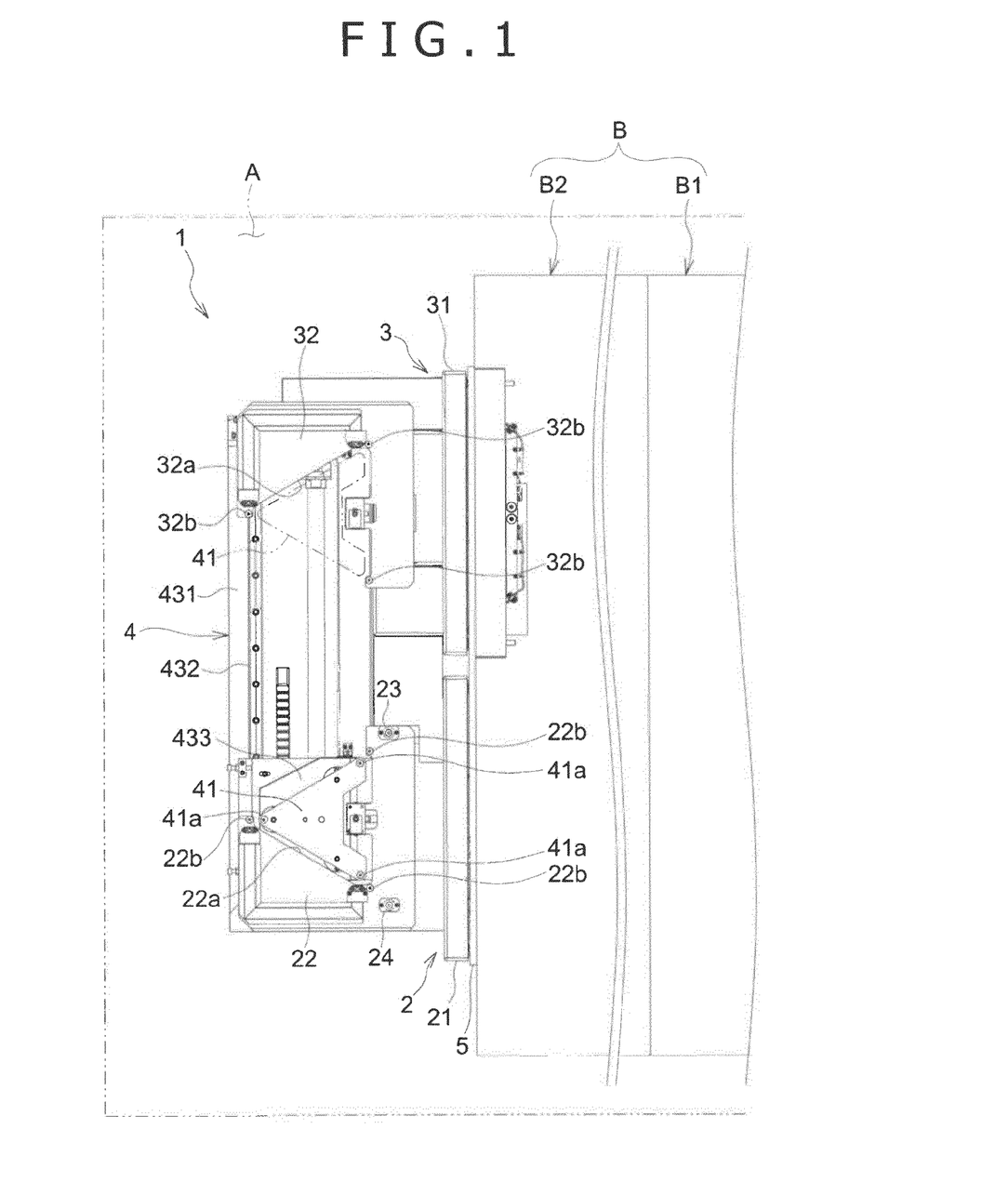
FIG. 1 is a plan view of a load port according to an embodiment of the present invention particularly illustrating a relative positional relationship between the load port and a semiconductor fabrication apparatus in a clean room.

Referring first to FIG. 1, the load port 1 according to the present embodiment is used in a fabrication process of semiconductors and is disposed adjacent a semiconductor fabrication apparatus B in a common clean room A. A door of the load port 1 on a FOUP 9 side is opened and closed in a closely contacting relationship, and the load port 1 transfers a wafer (not shown) accommodated in the FOUP 9 to and from the semiconductor fabrication apparatus B. It is to be noted that FIG. 1 is a plan view of the load port 1 and peripheral elements as viewed from above and schematically illustrating a relative positional relationship between the load port 1 and the semiconductor fabrication apparatus B in the clean room A.

Figure 2:
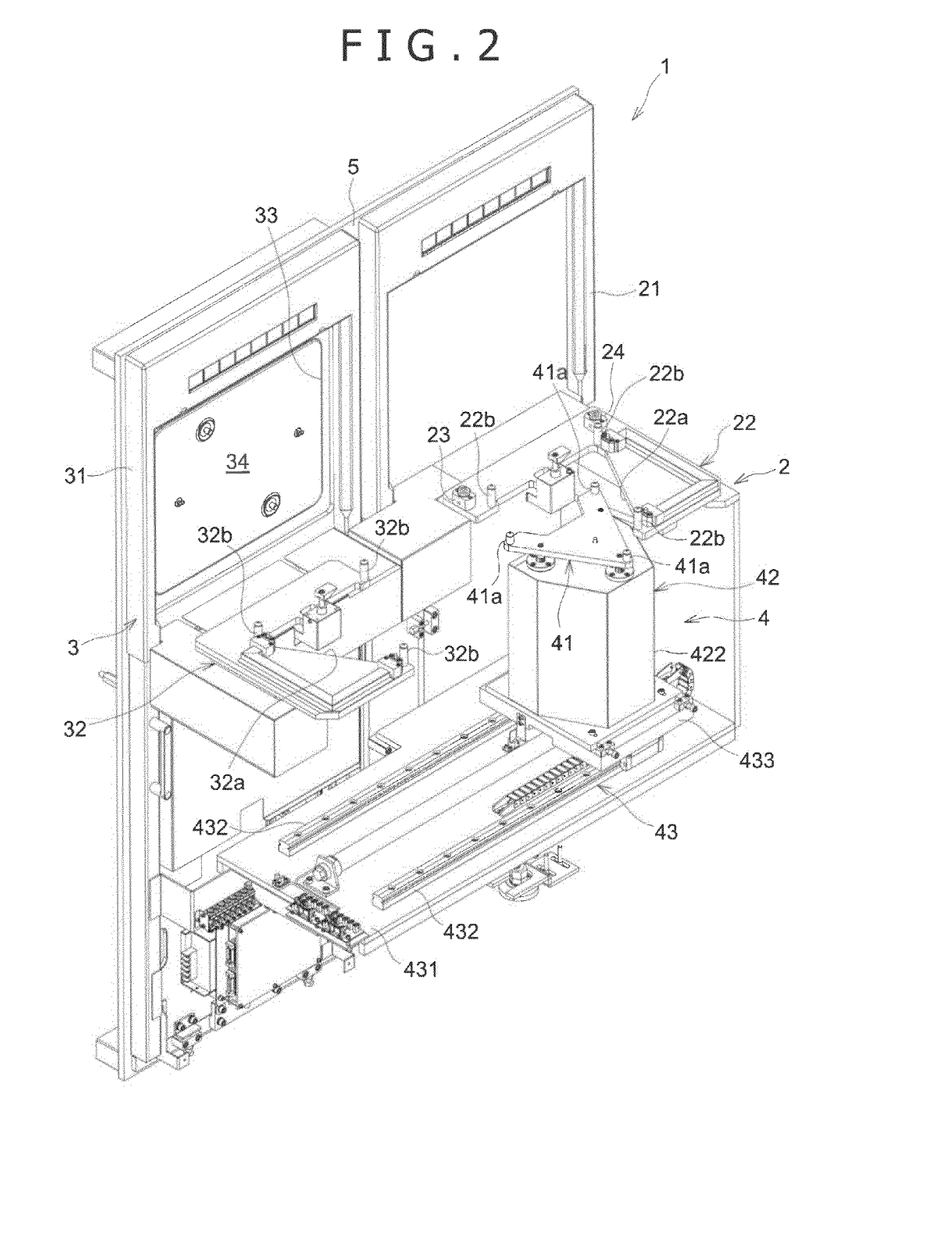
FIG. 2 is a schematic view of the entire load port shown in FIG. 1.
Figure 3:
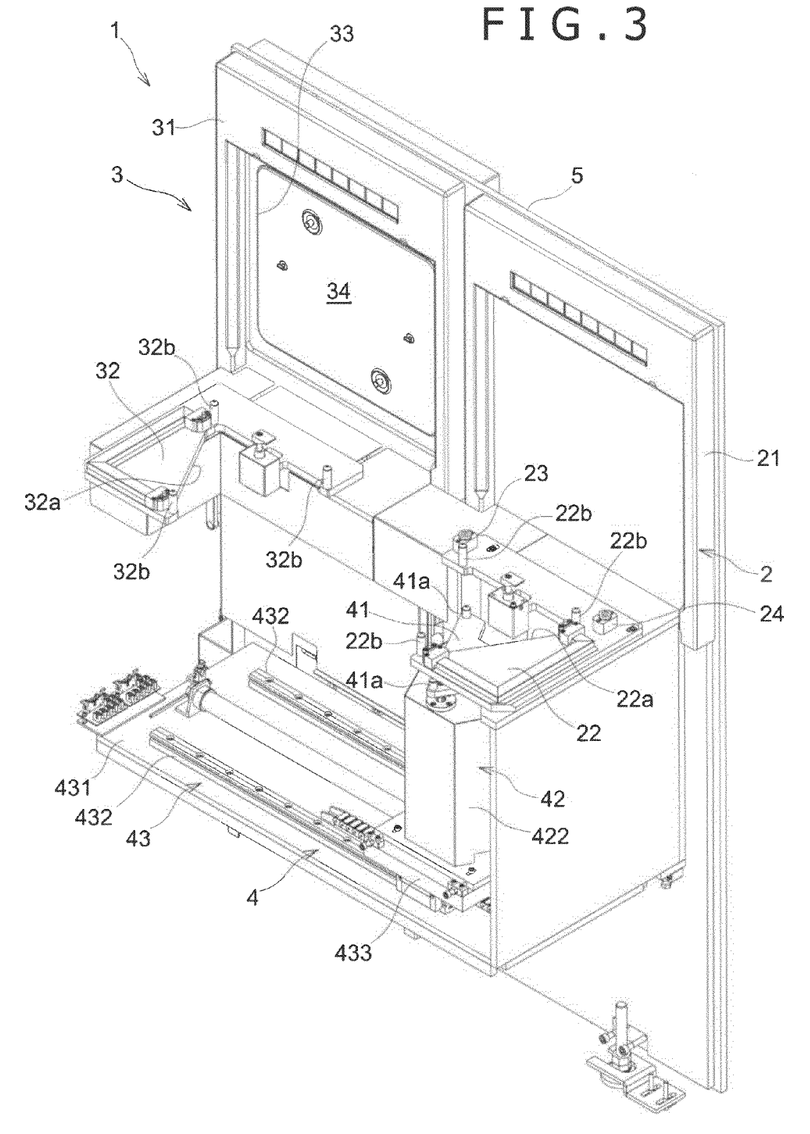
FIG. 3 is a schematic view of the entire load port shown in FIG. 1 but as viewed in a direction different from that in FIG. 2.
Figure 4:
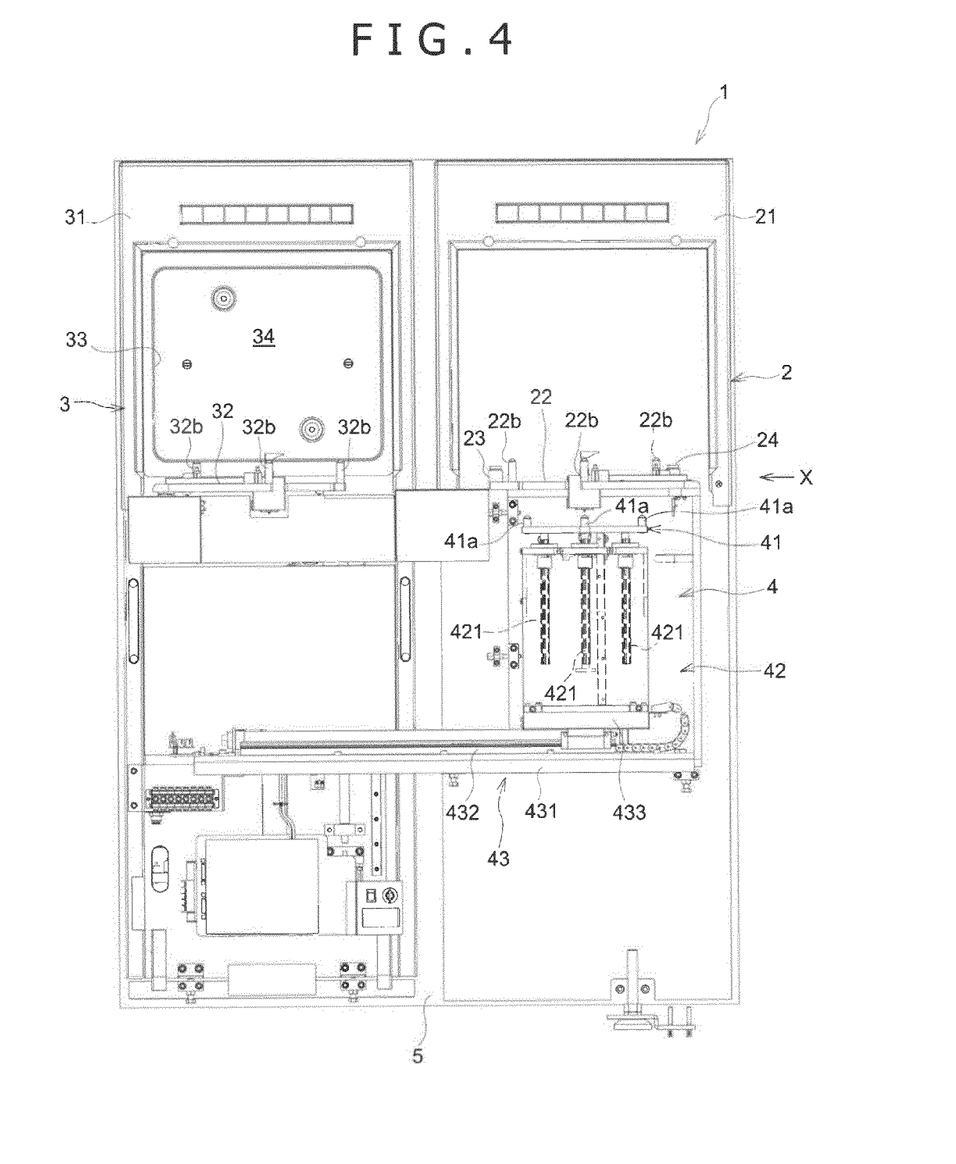
FIG. 4 is a front elevational view of the load port shown in FIG. 1.
Figure 5:
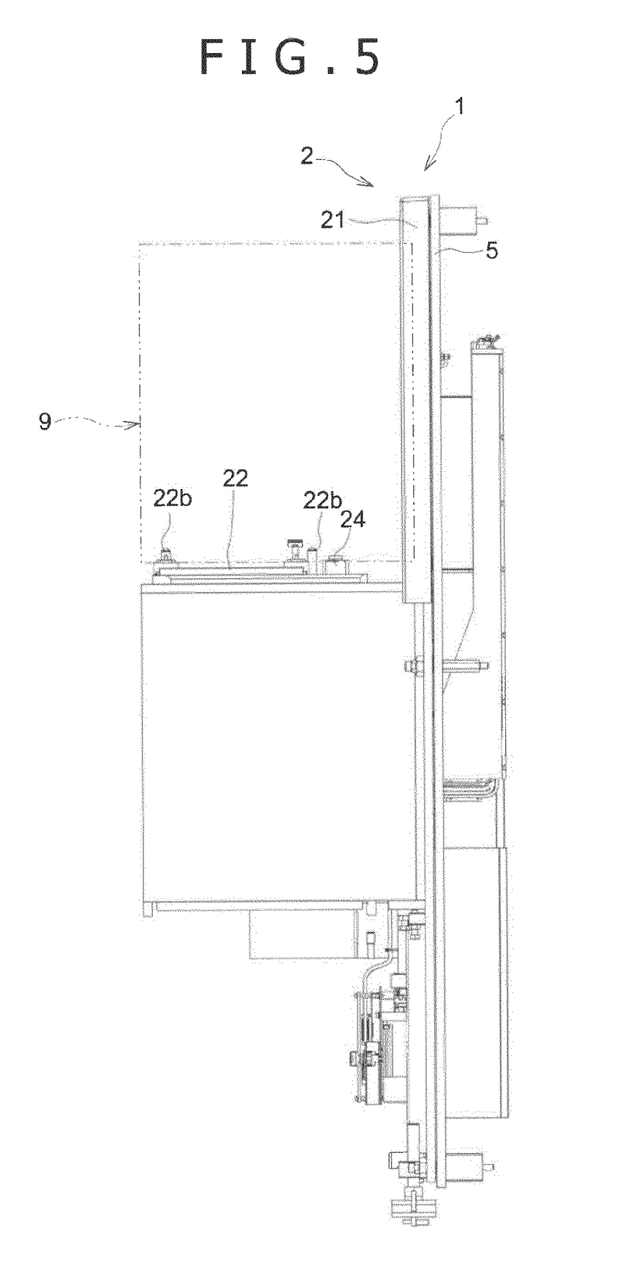
FIG. 5 is a view as viewed in the direction indicated by an arrow mark X of FIG. 4.

Referring to FIGS. 1 to 5 among which FIGS. 2 and 3 are schematic views of the entire load port 1 as viewed in different directions from each other and FIG. 4 is a front elevational view of the load port 1 while FIG. 5 is a side elevational view of the load port 1 as viewed in the direction indicated by an arrow mark X of FIG. 4, the load port 1 includes a purge stage 2 and an opener stage 3 provided integrally with each other. The purge stage 2 introduces such gas as nitrogen gas, inert gas or dry air (in the present embodiment, nitrogen gas is used) into the FOUP 9 to replace the gas atmosphere in the FOUP 9 into the nitrogen gas. The opener stage 3 discharges a wafer accommodated in the FOUP 9 into the semiconductor fabrication apparatus B and accommodates the wafer processed by the semiconductor fabrication apparatus B back into the FOUP 9. The load port 1 further includes a moving mechanism 4 for moving the FOUP 9 between the purge stage 2 and the opener stage 3.

The FOUP 9 applied in the present embodiment is a known apparatus, and therefore, detailed description is omitted herein. Referring to FIG. 1, the semiconductor fabrication apparatus B includes a semiconductor fabrication apparatus body B1 and a feeding chamber B2 disposed adjacent the semiconductor fabrication apparatus body B1. A feeding machine (not shown) for feeding wafers in the FOUP 9 one by one between the inside of the FOUP 9 and the inside of the feeding chamber B2 and between the inside of the feeding chamber B2 and the inside of the semiconductor fabrication apparatus body B1 is provided in the feeding chamber B2. It is to be noted that also it is possible to feed a cassette in which a plurality of wafers are accommodated between the FOUP 9 and the semiconductor fabrication apparatus B (semiconductor fabrication apparatus body B1 and feeding chamber B2). By such a configuration as described above, in the clean room A, the inside of the semiconductor fabrication apparatus body B1, the inside of the feeding chamber B2 and the inside of the FOUP 9 are maintained in a high degree of cleanness. Meanwhile, the space in which the load port 1 is disposed, that is, the space outside the semiconductor fabrication apparatus body B1, outside of the feeding chamber B2 and outside of the FOUP 9, indicates a comparatively low degree of cleanness. In the following, principally the configuration of the load port 1 of the present embodiment is described.

The purge stage 2 includes, as principal components thereof, a purge stage side frame 21 having a form of a substantially rectangular plate and disposed in a substantially vertical posture, a purge stage side receiving plate 22 provided in a substantially horizontal posture at a position displaced a little upwardly from a central portion of the purge stage side frame 21 in the heightwise direction and purge ports, that is, a introducing purge port 23 and a discharging purge port 24, provided on the purge stage side receiving plate 22. The purge stage side frame 21 is disposed on a front face of a common base frame 5 together with an opener stage side frame 31 hereinafter described. The load port 1 of the present embodiment can be used in a state wherein the rear face of the base frame 5 contacts closely with the front face of the semiconductor fabrication apparatus B, particularly, the feeding chamber B2 as seen in FIG. 1.

The purge stage side receiving plate 22 has a purge stage side cutaway portion 22a formed thereon for avoiding otherwise possible interference with a main table 41 of the moving mechanism 4 hereinafter described which can move vertically and horizontally. Further, three protrusions 22b are formed on the purge stage side receiving plate 22 in such a manner as to project upwardly such that they are engaged with holes (not shown) formed on the bottom of the FOUP 9 to position the FOUP 9 on the purge stage side receiving plate 22.

The purge ports, that is, the introducing purge port 23 and the discharging purge port 24, are provided in pair at positions spaced from each other along the widthwise direction of the purge stage side receiving plate 22, and one of the purge ports functions as the introducing purge port 23 for introducing nitrogen gas while the other purge port functions as the discharging purge port 24 for discharging the gas atmosphere in the FOUP 9. The introducing purge port 23 and the discharging purge port 24 have a valve function of stopping back flow of gas and can be connected to each other in a state wherein they are fitted with an inlet and an outlet (both not shown) provided on the bottom of the FOUP 9. It is to be noted that the fitting portions between the purge ports (introducing purge port 23 and 24) and the inlet and outlet are placed into a sealed state by packings or the like provided at end portions of the introducing purge port 23 and the discharging purge port 24.

Further, a pressure sensor is provided on the purge stage side receiving plate 22 such that, when it is detected that a pressing object portion of the pressure sensor is pressed by the bottom of the FOUP 9, nitrogen gas is blown out from the introducing purge port 23 in response to a signal from a control section not shown and introduced into the FOUP 9 through the inlet. Thereupon, gas such as air filled in the FOUP 9 is discharged to the outside of the FOUP 9 from the outlet of the FOUP 9 through the discharging purge port 24.

The opener stage 3 includes an opener stage side frame 31 having a form of a substantially rectangular plate and disposed in a substantially vertical posture, and an opener stage side receiving plate 32 provided in a substantially horizontal posture at a position displaced a little upwardly from a central portion of the opener stage side frame 31 in the heightwise direction. The opener stage 3 further includes an opening 33 having an opening lower edge set at a heightwise position substantially same as that of the opener stage side receiving plate 32 from within the opener stage side frame 31 and capable of communicating with the inside of the semiconductor fabrication apparatus B, particularly of the feeding chamber B2 and a door section 34 for opening and closing the opening 33. The opener stage side frame 31 and the purge stage side frame 21 are provided in a juxtaposed relationship on the front face of the common base frame 5, and the opener stage side frame 31 and the purge stage side frame 21 are disposed substantially linearly as viewed in plan (refer to FIG. 1).

The opener stage side receiving plate 32 has an opener stage side cutaway portion 32a formed therein for avoiding otherwise possible interference with the main table 41 of the moving mechanism 4 hereinafter described which can move vertically and horizontally. Further, three protrusions 32b are formed on the opener stage side receiving plate 32 in such a manner as to project upwardly. The three protrusions 32b are provided at locations corresponding to the three protrusions 22b provided on the purge stage side receiving plate 22. The three protrusions 32b are engaged with the holes (not shown) formed on the bottom of the FOUP 9 to achieve positioning of the FOUP 9 on the opener stage side receiving plate 32. In the present embodiment, the heightwise position of the opener stage side receiving plate 32 is set to a heightwise position same or substantially same as that of the purge stage side receiving plate 22.

The door section 34 is operable between an open state in which it opens the door (not shown) provided on the rear face of the FOUP 9 in a state wherein it contacts closely with the door in a state wherein the FOUP 9 is placed on the opener stage side receiving plate 32, and a closed state in which it isolates the internal space of the adjacent semiconductor fabrication apparatus B, particularly, of the feeding chamber B2 and the internal space of the FOUP 9 from each other. The door section 34 may have a known opening and closing structure.

Figure 6:
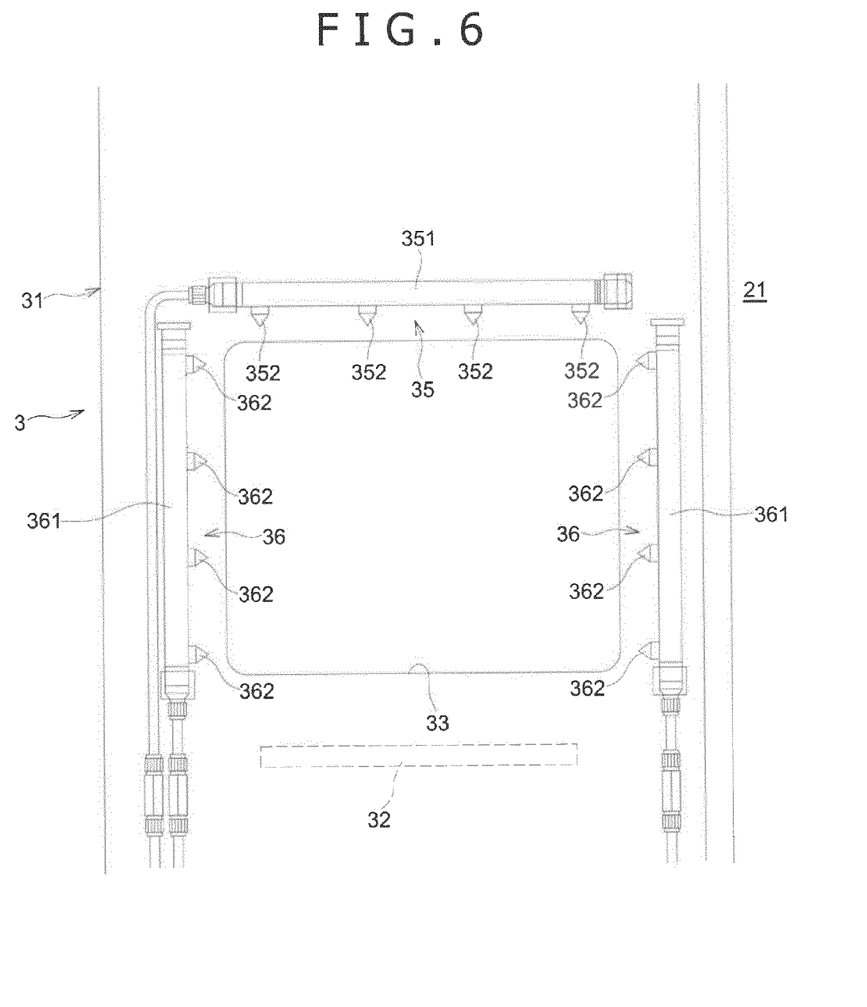
FIG. 6 is a view schematically showing a sub purge section of the load port shown in FIG. 1.

Further, referring to FIG. 6, the opener stage 3 includes sub purge sections, that is, a top sub purge section 35 and a pair of side sub purge sections 36, provided in the proximity of the opening 33 for blowing gas such as nitrogen gas, inert gas or dry air (in the present embodiment, nitrogen gas is used) into the FOUP 9 when the door section 34 is opened, that is, when the door section 34 is placed into an open state. In the present embodiment, the top sub purge section 35 is provided in the proximity of an upper edge portion of the opening 33 while the side sub purge sections 36 are provided in the proximity of the opposite side edge portions of the opening 33. The top sub purge section 35 and the side sub purge sections 36 are provided on the interior side, that is, on the semiconductor fabrication apparatus B side, with respect to the door section 34. It is to be noted that the top sub purge section 35 and the side sub purge sections 36 are incorporated in the opener stage side frame 31 such that, in an ordinary used state, they cannot be visually observed from the outside. FIG. 6 is a view showing part of FIG. 3 in an enlarged scale and schematically showing a structure of the sub purge sections, that is, the top sub purge section 35 and the side sub purge sections 36, and a relative positional relationship between the sub purge sections and the opening 33. For the convenience of illustration, the door section 34 and so forth are omitted in FIG. 6.

The top sub purge section 35 is formed from a plurality of top nozzles 352 branched from a gas pipe 351. In the present embodiment, totaling four top nozzles 352 are disposed in an equal pitch relationship along the top side of the opening 33 in a posture wherein the ends thereof are directed downwardly and forwardly toward the FOUP 9 side.

Each of the side sub purge sections 36 is formed from a plurality of side nozzles 362 branched from a gas pipe 361. In the present embodiment, totaling four side nozzles 362 are disposed in an equal pitch relationship along a side of the opening 33 in such a posture that the ends thereof are directed sidewardly and forwardly toward the FOUP 9 side.

Further, in the load port 1 according to the present embodiment, a mapping apparatus (not shown) for mapping the number and the position of wafers accommodated in the FOUP 9 is provided on the opener stage 3.

In this manner, the load port 1 of the present embodiment is configured such that the purge stage 2 and the opener stage 3 can be disposed on the front face of the semiconductor fabrication apparatus B, particularly of the feeding chamber B2, in a state wherein they are juxtaposed along the direction of the front face of the semiconductor fabrication apparatus B and along a horizontal direction such that the FOUP 9 is moved between the purge stage 2 and the opener stage 3 by the moving mechanism 4 described below.

The moving mechanism 4 includes a main table 41 having an upper face on which the FOUP 9 can be placed, a vertically moving section 42 for moving the main table 41 upwardly and downwardly, and a horizontally moving section 43 for horizontally moving the main table 41 between the purge stage 2 and the opener stage 3.

The main table 41 is a member in the form of a plate having, for example, a substantially triangular shape as viewed in plan and has three protrusions 41a formed thereon so as to project upwardly. The protrusions 41a are engaged with holes (not shown) different from those described hereinabove and formed on the bottom of the FOUP 9 to position the FOUP 9 on the main table 41. In particular, six positioning holes are formed on the bottom of the FOUP 9, and three of the six positioning holes can be engaged with the protrusions 41a of the main table 41 while the remaining three can be engaged with the protrusions 22b of the purge stage side receiving plate 22 or the protrusions 32b of the opener stage side receiving plate 32.

The vertically moving section 42 moves the main table 41 upwardly and downwardly between a lowered position set to a position lower than the position of the purge stage side receiving plate 22 and the opener stage side receiving plate 32 and a lifted position set to a position higher than the position of the purge stage side receiving plate 22 and the opener stage side receiving plate 32. The vertically moving section 42 is formed using a plurality of cylinders 421 of the liquid pressure type or the gas pressure type (refer to FIG. 4). The cylinders 421 are covered with a cover member 422.

The horizontally moving section 43 horizontally moves the main table 41 between a purge stage side position indicated by solid lines in FIG. 1 at which the main table 41 can fit with the purge stage side cutaway portion 22a formed on the purge stage side receiving plate 22 at least as viewed in plan and an opener stage side position indicated by broken lines in FIG. 1 at which the main table 41 can fit with the opener stage side cutaway portion 32a formed on the opener stage side receiving plate 32 at least as viewed in plan. The horizontally moving section 43 includes a rail supporting plate 431 provided in a horizontal posture in a region over the purge stage side frame 21 and the opener stage side frame 31, a rail 432, in the example shown in FIG. 2, two rails 432, provided on the rail supporting plate 431 and having a longitudinal direction coincident with the widthwise direction of the load port 1, and a carriage 433 movable along the rails 432. In the present embodiment, the vertically moving section 42 ad the main table 41 are disposed on the carriage 433.

It is to be noted that, upon ordinary use of the load port 1, the vertically moving section 42 and the horizontally moving section 43 from within the moving mechanism 4 are covered with a cover (not shown). Further, the moving mechanism 4 may have a function of moving the main table 41 so that the FOUP 9 placed on the main table 41 may be connected to the door section 34 or another function of changing the direction of or moving the FOUP 9 placed in an arbitrary direction from a transport apparatus to a correct direction.

Now, a method of use and operation of the load port 1 having such a configuration as described above are described.

First, the FOUP 9 is transported by the transport apparatus not shown to the load port 1. The transported FOUP 9 is placed on the main table 41 positioned at the purge stage side position at the lifted position and is then placed on the purge stage side receiving plate 22 by a downward movement of the main table 41 from the lifted position to the lowered position by the vertically moving section 42. Thereupon, the protrusions 22b provided on the purge stage side receiving plate 22 are engaged into the holes formed on the bottom of the FOUP 9. Simultaneously or substantially simultaneously with the placement of the FOUP 9 on the purge stage side receiving plate 22, the introducing purge port 23 and the discharging purge port 24 provided on the purge stage side receiving plate 22 are respectively connected to the inlet and the outlet formed on the bottom of the FOUP 9. Then, nitrogen gas is introduced from the introducing purge port 23 into the FOUP 9 so that gas filled in the FOUP 9 is discharged from the discharging purge port 24 to the outside of the FOUP 9.

Then, the FOUP 9 having the internal space filled with the nitrogen gas is moved from the purge stage 2 to the opener stage 3 by the moving mechanism 4. In particular, the main table 41 positioned at the lowered position is moved to the lifted position by the vertically moving section 42. During the upward movement, the FOUP 9 is transferred from the purge stage side receiving plate 22 to the main table 41. Thereupon, the protrusions 41a provided on the main table 41 are engaged into the holes formed on the bottom of the FOUP 9. Continuously, the main table 41 is moved from the purge stage side position to the opener stage side position by the horizontally moving section 43. The main table 41 is moved from the upper position to the lowered position by the vertically moving section 42 to place the FOUP 9 on the opener stage side receiving plate 32. Thereupon, the protrusions 32b provided on the opener stage side receiving plate 32 are engaged into the holes formed on the bottom of the FOUP 9.

Then, immediately after the FOUP 9 is placed on the opener stage side receiving plate 32, wafers in the FOUP 9 are successively delivered from the opener stage 3 into the semiconductor fabrication apparatus B. In particular, in a state wherein the door section 34 of the opener stage 3 contacts closely with the door (not shown) of the FOUP 9, the door section 34 is placed into an open state from a closed state, and in a state wherein the opening 33 is open, the wafers in the FOUP 9 are successively fed into the semiconductor fabrication apparatus B by a feeder provided in the feeding chamber B2. Wafers fed into the feeding chamber B2 are subsequently fed into the semiconductor fabrication apparatus body B1, by which they are subjected to a semiconductor fabrication processing step. The wafers for which the semiconductor fabrication processing step by the semiconductor fabrication apparatus body B1 is completed are successively stored into the FOUP 9 through the inside of the semiconductor fabrication apparatus body B1 by the feeder. In the load port 1 according to the present embodiment, when the opening 33 of the opener stage 3 is opened, or in other words, when the door section 34 is placed into an open state, or furthermore, when a wafer is transferred between the inside of the FOUP 9 and the inside of the semiconductor fabrication apparatus B, nitrogen gas is blown from the top sub purge section 35 and the side sub purge sections 36 toward the inside of the FOUP 9. Consequently, when a wafer is transferred between the inside of the FOUP 9 and the inside of the semiconductor fabrication apparatus B, the gas atmosphere in the FOUP 9 can be replaced into nitrogen gas although the level is low or surplus water can be removed from the gas atmosphere in the FOUP 9.

After all wafers are accommodated into the FOUP 9 after completion of the semiconductor fabrication processing step, the door section 34 of the opener stage 3 is placed into a closed state from the open state in the state wherein it contacts closely with the door of the FOUP 9, and the opening 33 is closed up. Continuously, the FOUP 9 placed on the opener stage side receiving plate 32 is carried out to a next step by a transport apparatus not shown. It is to be noted that, if necessary, the FOUP 9 in which the wafers for which the semiconductor fabrication processing step is completed are accommodated may be moved from the opener stage 3 to the purge stage 2 by the moving mechanism 4 such that the wafers are subjected to the purge processing step again by the purge stage 2. By the configuration just described, the purge process can be started immediately for the FOUP 9 in which the wafers for which the semiconductor fabrication processing step is completed are accommodated. Consequently, prevention of oxidation of the processed wafers can be anticipated.

Further, by carrying out a purge process for the FOUP 9 of a next lot transferred to the purge stage 2 simultaneously or substantially simultaneously after a process of transferring the wafers from the inside of the FOUP 9 to the inside of the semiconductor fabrication apparatus B in the opener stage, the transferring processing step and the purge processing step of wafers on the load port 1 can be carried out efficiently. Consequently, reduction of the processing time for one FOUP 9 can be achieved.

In this manner, in the load port 1 according to the present embodiment, the purge stage 2 having the introducing purge port 23 and the discharging purge port 24 and the opener stage 3 having the door section 34 which can open and close the opening 33 which communicates with the inside of the semiconductor fabrication apparatus B are provided in a juxtaposed relationship with each other. Therefore, while the purge operation of replacing the gas atmosphere in the FOUP 9 into gas such as nitrogen gas or dry air through the introducing purge port 23 and the discharging purge port 24 is carried out in the purge stage 2, in the opener stage 3, wafers can be transferred between the inside of the FOUP 9 and the inside of the semiconductor fabrication apparatus B. Consequently, the original function of the FOUP 9 of transferring wafers between the inside of the FOUP 9 and the inside of the semiconductor fabrication apparatus B can be exhibited even during a purge operation, and the operation efficiency is improved significantly. Even where the purge operation is carried out after wafers are transferred between the inside of the FOUP 9 and the inside of the semiconductor fabrication apparatus B, there is no necessity to leave the FOUP 9 in the opener stage 3, and the transferring process of wafers can be carried out continuously for a FOUP 9 of a next lot without preventing occurrence of significant time loss.

Besides, since the load port 1 according to the present embodiment further includes the moving mechanism 4 for moving the FOUP 9 between the purge stage 2 and the opener stage 3, the position at which the purge operation is carried out and the position at which wafers are transferred between the inside of the FOUP 9 and the inside of the semiconductor fabrication apparatus B can be disposed as near as possible. Consequently, the distance of movement of the FOUP 9 can be made short to achieve reduction of the time for movement of the FOUP 9, and further enhancement of the operation efficiency can be anticipated.

Particularly since the opener stage 3 includes the sub purge sections, that is, the top sub purge section 35 and the side sub purge sections 36, which can introduce nitrogen gas into the FOUP 9 when the opening 33 is opened, when wafers are transferred between the inside of the FOUP 9 and the inside of the semiconductor fabrication apparatus B, nitrogen gas can be blown from the top sub purge section 35 and the side sub purge sections 36 toward the inside of the FOUP 9 to replace the gas atmosphere in the FOUP 9 into nitrogen gas or remove surplus water. Consequently, prevention of oxidation of the wafers can be achieved and a bad influence of humidity can be prevented. Further, in an ordinary case, that one of a plurality of wafers accommodated in the common FOUP 9 which is accommodated into the FOUP 9 after completion of the semiconductor fabrication processing step first remains exposed to the gas atmosphere wherein the filling factor or degree of substitution of nitrogen gas drops as the transferring operation time of wafers elapses in the FOUP 9 until another wafer which is processed by the semiconductor fabrication processing step last is accommodated into the FOUP 9. Consequently, a bad influence can still be had but a little. However, by blowing nitrogen gas from the top sub purge section 35 and the side sub purge sections 36 toward the inside of the FOUP 9, the drop of the filling factor or degree of substitution of the nitrogen gas can be suppressed effectively. Consequently, wafers can be left accommodated in a good state in the FOUP 9.

Figure 7:
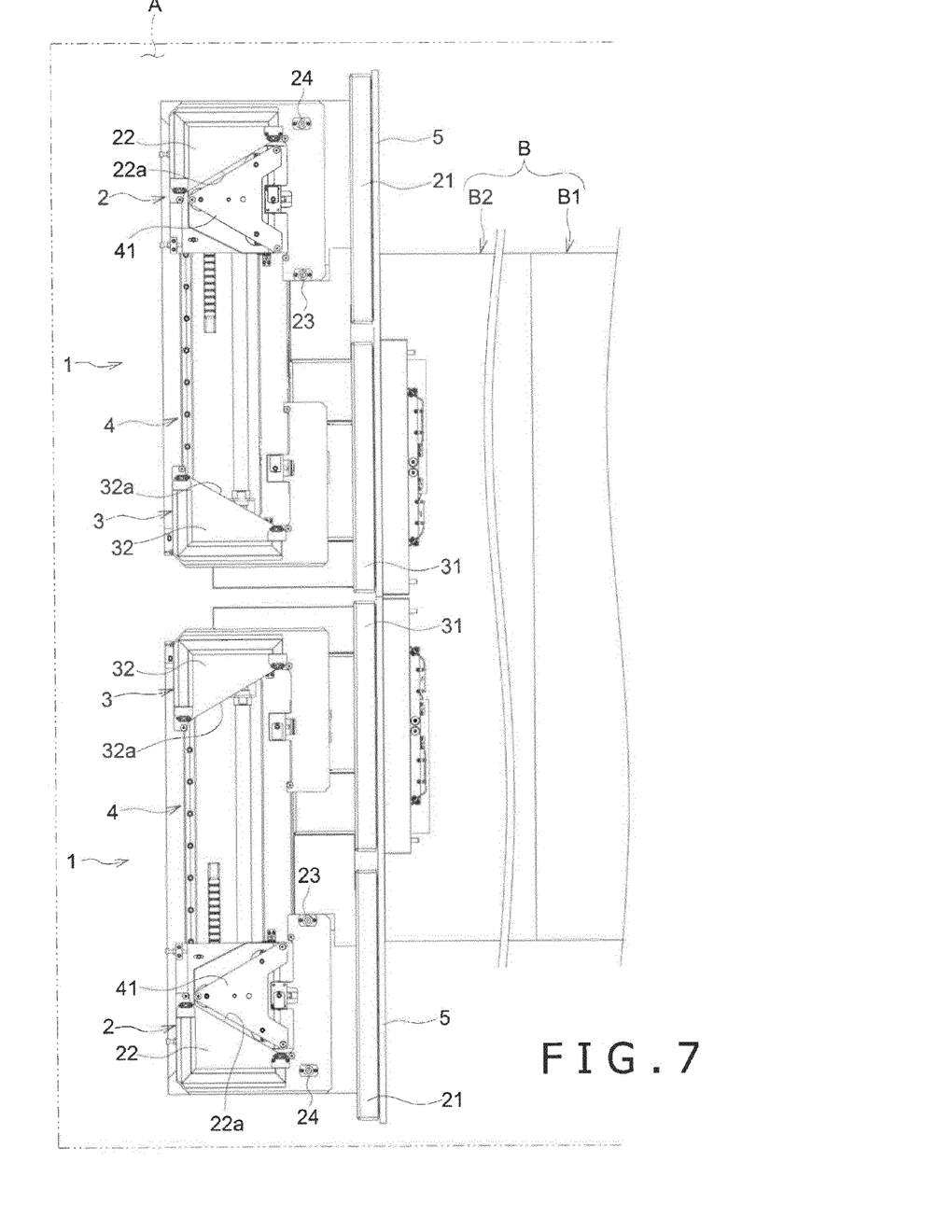
FIG. 7 is a view similar to FIG. 1 but showing a mode wherein such load ports as shown in FIG. 1 are disposed in a juxtaposed relationship with each other.

It is to be noted that the present invention is not limited to the embodiment described above. For example, the relative positional relationship between the purge stage and the opener stage can be reversed. Further, if two load ports 1 according to the present embodiment are juxtaposed as shown in FIG. 7 and the relative positional relationship between the purge stage 2 and the opener stage 3 in each load port 1 is set such that the opener stages 3 of the load ports 1 are positioned adjacent each other, then wafers in a FOUP 9 placed on any of the opener stages 3 can be transferred efficiently from and to the common semiconductor fabrication apparatus B. In this instance, the purge stages 2 of the load ports 1 need not be positioned in direct contact with the semiconductor fabrication apparatus B.

Further, the number and location of purge ports (introduction purge ports an discharging purge ports) in the purge stage may be changed suitably. The sub purge sections in the opener stage may be disposed in only one of the top sub purge section and the side sub purge sections, or otherwise may be formed from a bottom sub purge section provided in the proximity of a lower edge of the opening. Also the number and shape of blow-off ports, which correspond to the nozzles in the embodiment described hereinabove, of the sub purge sections may be changed suitably.

Further, the moving mechanism may be of any type only if a FOUP can be moved at least between the purge stage and the opener stage and may have only the function of horizontally moving a FOUP. Further, where the moving mechanism includes a main table, the shape of the main table as viewed in plan and so forth may be changed suitably, and a cutaway portion of a predetermined shape which prevents otherwise possible interference with the main table may be formed on the purge stage side receiving plate and the opener side receiving plate. The moving mechanism may be of a different type which does not include a main table but moves a FOUP in a suspended state between the purge stage and the opener stage or slidably moves a FOUP on a predetermined belt between the purge stage and the opener stage.

Furthermore, the feeding machine provided in the feeding chamber in the embodiment described above may be of a type wherein a multi-stage cassette removably set in a FOUP and accommodating a plurality of wafers therein is fed between the inside of the FOUP and the inside of the semiconductor fabrication apparatus. Further, the load port may be provided adjacent a semiconductor fabrication apparatus which does not have a feeding chamber.

Further, the particular configuration of the components is not limited to that of the embodiment described above but various modifications are possible without departing from the sprit and scope of the present invention.

What is claimed is:

1. A load port system to receive and process sealable pods, comprising:
    a purge stage including a purge portion that discharges a gas atmosphere in a sealable pod from an inside of the sealable pod and introduces nitrogen gas or dry air to the inside of the sealable pod, and a purge stage side receiving plate that receives the sealable pod on the purge stage side receiving plate;
    an opener stage including a closeable opening communicating an inside of a fabrication apparatus with the inside of the sealable pod, and an open stage side receiving plate that receives the sealable pod on the open stage side receiving plate, the opener stage and the purge stage being juxtapositioned only substantially in a horizontal direction; and
    a moving mechanism configured to move the sealable pod substantially in a horizontal direction between the purge stage and the opener stage, at least a portion of said moving mechanism being disposed directly under the opener stage and the purge stage regardless of whether the moving mechanism has the sealable pod positioned at the purge stage or the opener stage, wherein
    the moving mechanism comprises a table having an upper face on which the sealable pod can be placed,
    the moving mechanism moves only substantially in the horizontal direction when the moving mechanism moves between the purge stage and the opener stage with the sealed pod placed on the table,
    the purge stage side receiving plate comprises a purge stage side cutaway portion formed on the purge stage side receiving plate,
    the open stage side receiving plate comprises an open stage side cutaway portion formed on the open stage side receiving plate, the purge stage side receiving plate and the open stage side receiving plate being arranged substantially at a same height in a vertical direction orthogonal to the horizontal direction, and
    the purge stage side cutaway portion and the open stage side cutaway portion face each other in the horizontal direction.

2. The system of claim 1, wherein the sealable pod is a front opening unified pod which stores and transports one or more wafers.

3. The system of claim 1, wherein the purge portion further comprises:
    an introducing purge port to introduce the nitrogen gas or dry air to the inside of the sealable pod; and
    a discharging purge port to discharge the gas atmosphere in the sealable pod from the inside of the sealable pod.

4. The system of claim 3, wherein the purge stage further comprises a pressure sensor that detects the sealable pod and that signals a control section which controls the introducing purge port and the discharging purge port.

5. The system of claim 1, wherein the purge stage further comprises at least one positioner that couples with the sealable pod to position the sealable pod at the purge stage.

6. The system of claim 1, wherein the opener stage comprises:
    a door section attached to a door frame, the door frame including the closeable opening when the door section is in an open position, the door section contacting a side of the sealable pod including a pod door creating a contact seal, wherein
    opening the door section opens the pod door to provide the closeable opening communicating the inside of the fabrication apparatus with the inside of the sealable pod, and
    closing the door section closes the pod door thus closing the closeable opening and isolating the inside of a fabrication apparatus from the inside of the sealable pod.

7. The system of claim 6, wherein the opener stage further comprises a sub purge portion that blows gas inside the sealable pod while the door section is opening.

8. The system of claim 7, wherein the sub purge portion comprises:
    a top sub purge section including a plurality of nozzles, the top sub purge section located on an upper edge portion of the closeable opening; and
    side sub purge sections including a plurality of nozzles, the side sub purge sections located on opposite side edge portions of the closeable opening, the top sub purge section and the side sub purge sections located on a fabrication apparatus side, wherein
    the nozzles of the top sub purge section are directed downwardly toward the inside of the sealable pod and the nozzles of the side portions are directed laterally toward the inside of the sealable pod.

9. The system of claim 1, wherein the opener stage further comprises at least one positioner that couples with the sealable pod to position the sealable pod at the opener stage.

10. The system of claim 1, wherein the moving mechanism comprises:
    a vertical movement section and a horizontal movement section wherein,
    the moving mechanism moves only substantially in the vertical direction by the vertical movement section when placing the sealed pod on the purge stage side receiving plate, transferring the sealed pod placed on the purge stage side receiving plate to the table, placing the sealed pod on the open stage side receiving plate, and transferring the sealed pod placed on the open stage side receiving plate to the table,
    the table includes positioners to position the sealable pod while the sealable pod is moved between the purge stage and the opener stage, and
    the positioners are protrusions protruding upwardly from the table, a bottom side of the sealable pod including corresponding holes engageable with the protrusions.

11. The system of claim 10, wherein
    the vertical movement section comprises one or more linear actuators attached to the table and the horizontal movement section, and
    the horizontal movement moving section comprises one or more rails, a carriage movable along the one or more rails, and a linear actuator attached to the carriage and to a fixed support plate, the carriage attached to the vertical movement section.

12. The system of claim 11, wherein the linear actuator of the horizontal movement section is disposed below a level of the carriage.

13. The system of claim 1, further comprising one or more rails to move the moving mechanism substantially in the horizontal direction between the purge stage and the opener stage, wherein the moving mechanism is configured so that the table on the moving mechanism is always directly above the rails.

14. The system of claim 1, wherein the moving mechanism moves only substantially in the vertical direction when placing the sealed pod on the purge stage side receiving plate, transferring the sealed pod placed on the purge stage side receiving plate to the table, placing the sealed pod on the open stage side receiving plate, and transferring the sealed pod placed on the open stage side receiving plate to the table.

15. The system of claim 14, wherein the moving mechanism moves downward when placing the sealed pod on the purge stage side receiving plate, moves upward when transferring the sealed pod placed on the purge stage side receiving plate to the table, moves downward when placing the sealed pod on the open stage side receiving plate, and moves upward when transferring the sealed pod placed on the open stage side receiving plate to the table.

16. A load port system provided adjacent a semiconductor fabrication apparatus in a clean room to receive a FOUP and to transfer wafers accommodated in the FOUP between an inside of the semiconductor fabrication apparatus and an inside of the FOUP, comprising:

a purge stage including a purge portion through which a gas atmosphere in the FOUP is replaced with nitrogen gas or dry air, and a purge stage side receiving plate that receives the FOUP on the purge stage side receiving plate;

an opener stage provided in only a substantially horizontal and juxtaposed relationship with the purge stage and including an opening communicating with the inside of the semiconductor fabrication apparatus, a door section to open and close the opening, and an open stage side receiving plate that receives the FOUP on the open stage side receiving plate; and a moving mechanism configured to move the FOUP substantially in a horizontal direction between the purge stage and the opener stage, at least a portion of said moving mechanism being disposed directly under the opener stage and the purge stage regardless of whether the moving mechanism has the sealable pod positioned at the purge stage or the opener stage, wherein the moving mechanism comprises a table having an upper face on which the sealable pod can be placed, the moving mechanism moves only substantially in the horizontal direction when the moving mechanism moves between the purge stage and the opener stage with the FOUP placed on the table, the purge stage side receiving plate comprises a purge stage side cutaway portion formed on the purge stage side receiving plate, the open stage side receiving plate comprises an open stage side cutaway portion formed on the open stage side receiving plate, the purge stage side receiving plate and the open stage side receiving plate being arranged substantially at a same height in a vertical direction orthogonal to the horizontal direction, and the purge stage side cutaway portion and the open stage side cutaway portion face each other in the horizontal direction.

17. The system according to claim 16, wherein the opener stage includes a sub purge section that blows nitrogen gas or dry air into the FOUP when the door section is operated to open the opening.

* * * * *